United States Patent
Park et al.

(10) Patent No.: US 11,018,382 B2
(45) Date of Patent: May 25, 2021

(54) SYSTEM AND METHOD FOR ASSIGNING UNIQUE NUMBER TO CELL MODULE CONTROLLER

(71) Applicant: LG CHEM, LTD., Seoul (KR)

(72) Inventors: Jun Cheol Park, Daejeon (KR); Keunwook Lee, Daejeon (KR)

(73) Assignee: LG CHEM, LTD., Seoul (KR)

(*) Notice: Subject to any disclaimer, the term of this patent is extended or adjusted under 35 U.S.C. 154(b) by 253 days.

(21) Appl. No.: 16/303,984

(22) PCT Filed: Nov. 28, 2017

(86) PCT No.: PCT/KR2017/013666
§ 371 (c)(1),
(2) Date: Nov. 21, 2018

(87) PCT Pub. No.: WO2018/151398
PCT Pub. Date: Aug. 23, 2018

(65) Prior Publication Data
US 2020/0176825 A1  Jun. 4, 2020

(30) Foreign Application Priority Data
Feb. 15, 2017  (KR) .................. 10-2017-0020549

(51) Int. Cl.
*H01M 10/42* (2006.01)
*G01R 31/396* (2019.01)
(Continued)

(52) U.S. Cl.
CPC ........ *H01M 10/425* (2013.01); *G01R 31/396* (2019.01); *H01M 10/48* (2013.01);
(Continued)

(58) Field of Classification Search
CPC .............. H01M 10/425; H01M 10/48; H01M 2010/4271; H01M 10/486; H02J 7/0013;
(Continued)

(56) References Cited

U.S. PATENT DOCUMENTS 5,945,803 A  8/1999  Brotto et al.
9,350,176 B2  5/2016  Kwon et al.
(Continued)

FOREIGN PATENT DOCUMENTS

CN  103098294 A  5/2013
CN  104956562 A  9/2015
(Continued)

OTHER PUBLICATIONS

Extended European Search Report dated Jul. 9, 2019, for European Application No. 17897006.7.
(Continued)

*Primary Examiner* — Melissa J Koval
*Assistant Examiner* — Trung Q Nguyen
(74) *Attorney, Agent, or Firm* — Birch, Stewart, Kolasch & Birch, LLP

(57) ABSTRACT

A method for assigning a unique number to a cell module controller including applying unique number assignment signals to one or more resistor units connected to one or more cell module controllers, respectively, through a main BMS and assigning unique numbers to one or more cell module controllers based on voltage values of the unique number assignment signals applied to one or more resistor units, respectively.

10 Claims, 5 Drawing Sheets

(51) Int. Cl.
*H01M 10/48* (2006.01)
*H02J 7/00* (2006.01)

(52) U.S. Cl.
CPC .......... *H02J 7/0029* (2013.01); *H02J 7/0047* (2013.01); *H01M 2010/4271* (2013.01)

(58) Field of Classification Search
CPC ...... H02J 7/0029; H02J 7/0047; H02J 7/0016; G01R 31/396; G01R 31/3842; Y02T 10/70
USPC ............ 324/426–436, 500, 761.01; 320/112, 320/118, 134; 429/61, 320
See application file for complete search history.

(56) References Cited

U.S. PATENT DOCUMENTS

| | | | |
|---|---|---|---|
| 9,804,582 B2 | 10/2017 | Jung | |
| 2011/0175564 A1 | 7/2011 | Shim | |
| 2012/0293133 A1 | 11/2012 | Kim | |
| 2012/0319654 A1* | 12/2012 | Li | H02J 7/00308 320/118 |
| 2013/0046495 A1 | 2/2013 | Sim | |
| 2014/0018990 A1 | 1/2014 | Kataoka et al. | |
| 2014/0150961 A1 | 6/2014 | Hama et al. | |
| 2015/0127205 A1* | 5/2015 | Brochhaus | H02J 7/00036 701/22 |
| 2015/0153423 A1 | 6/2015 | Fink | |
| 2015/0349550 A1* | 12/2015 | Jeon | H01M 10/441 320/134 |
| 2015/0372518 A1 | 12/2015 | Toya et al. | |
| 2017/0117721 A1* | 4/2017 | Toya | H02J 7/0016 |
| 2017/0219656 A1 | 8/2017 | Kim | |

FOREIGN PATENT DOCUMENTS

| | | |
|---|---|---|
| EP | 0 964 258 A2 | 12/1999 |
| EP | 2667446 A1 | 11/2013 |
| EP | 2720348 A2 | 4/2014 |
| JP | 2001-283934 A | 10/2001 |
| JP | 2015-113108 A | 6/2015 |
| JP | 2015-180179 A | 10/2015 |
| JP | 2015-529791 A | 10/2015 |
| JP | 2016-201217 A | 12/2016 |
| KR | 10-1027965 B1 | 4/2011 |
| KR | 10-1104667 B1 | 1/2012 |
| KR | 10-2013-0079931 A | 7/2013 |
| KR | 10-1433478 B1 | 9/2014 |
| KR | 10-2015-0084272 A | 7/2015 |
| KR | 10-2016-0045280 A | 4/2016 |
| KR | 10-1632350 B1 | 6/2016 |
| WO | WO 2013/014759 A1 | 1/2013 |

OTHER PUBLICATIONS

International Search Report for PCT/KR2017/013666 dated Feb. 8, 2018.

* cited by examiner

[Figure 1]
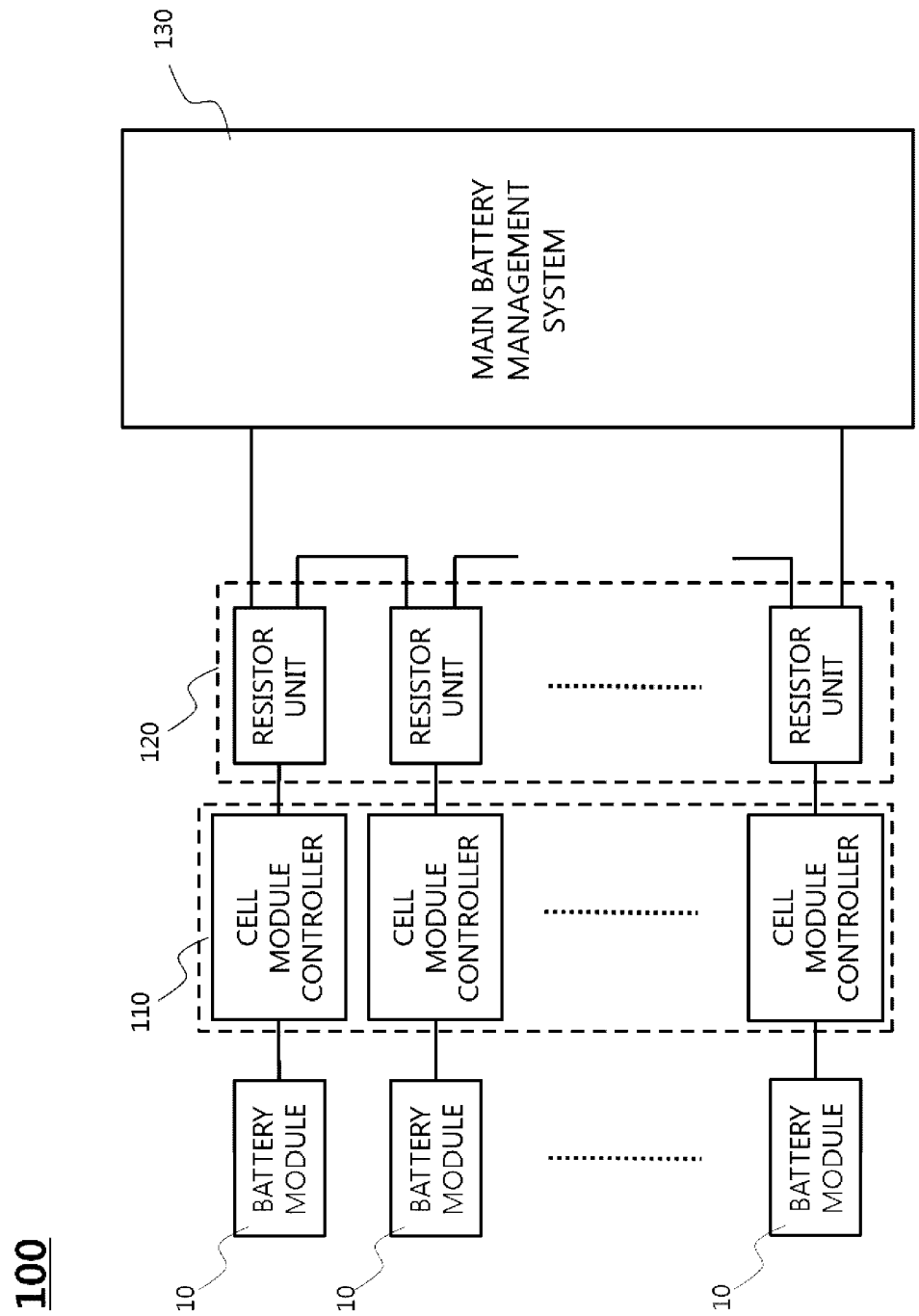

[Figure 2]
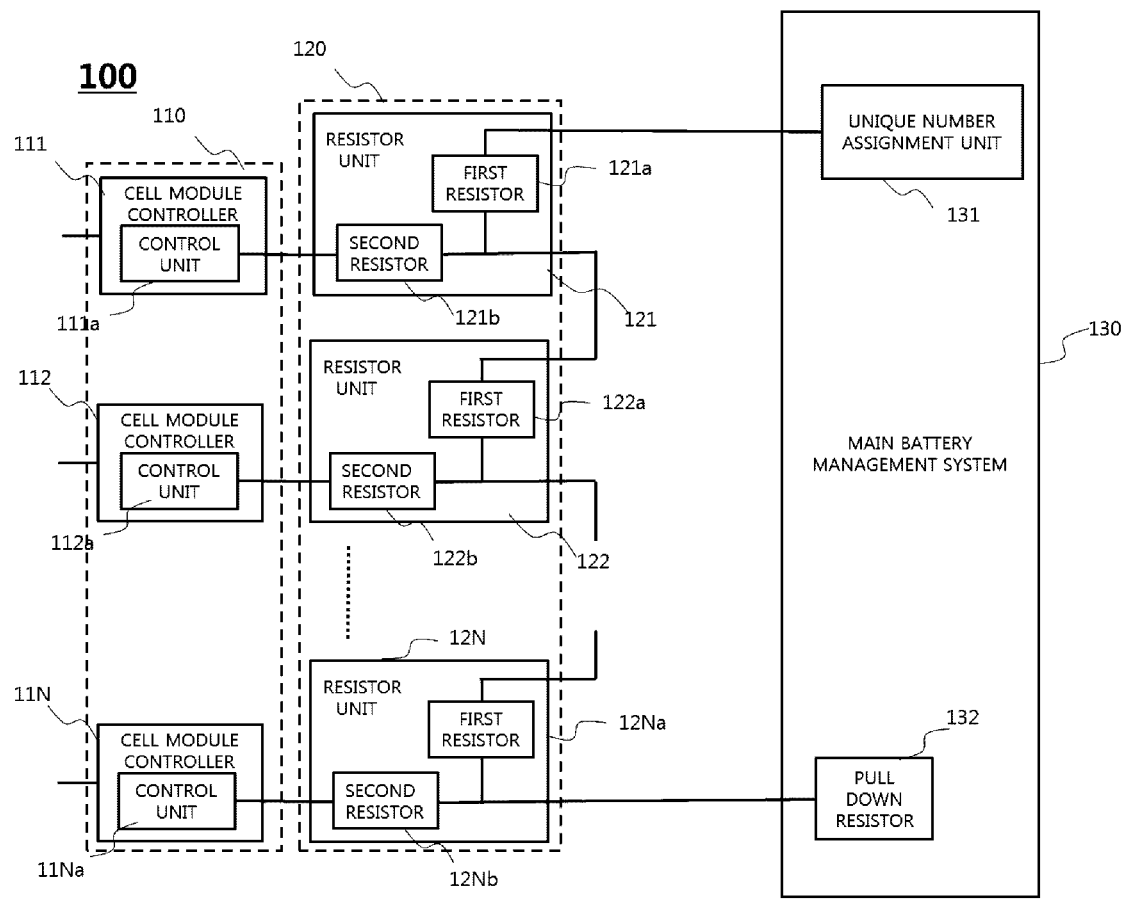

[Figure 3]
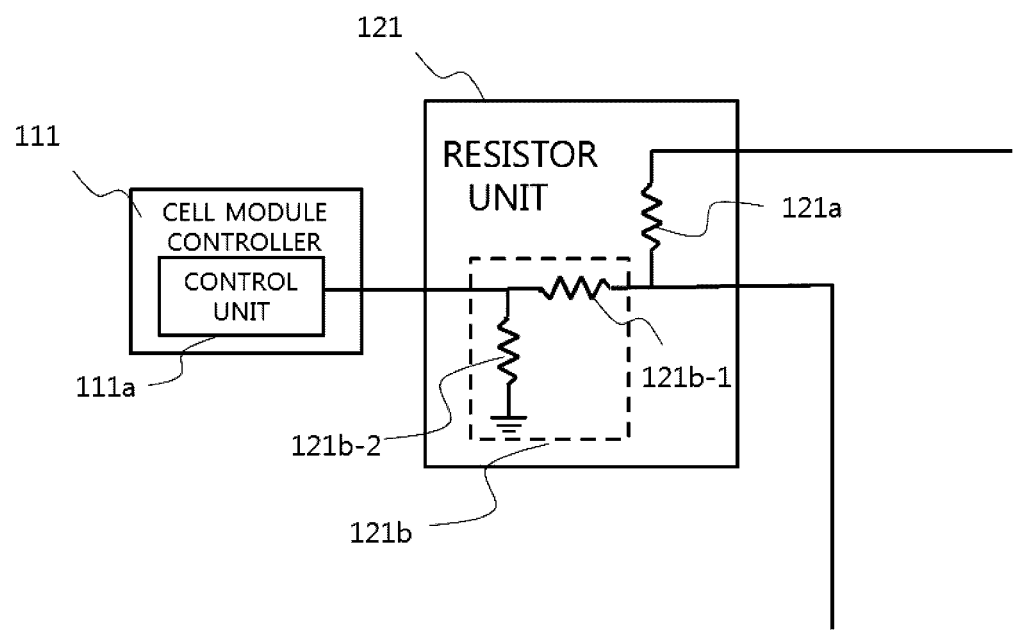

[Figure 4]
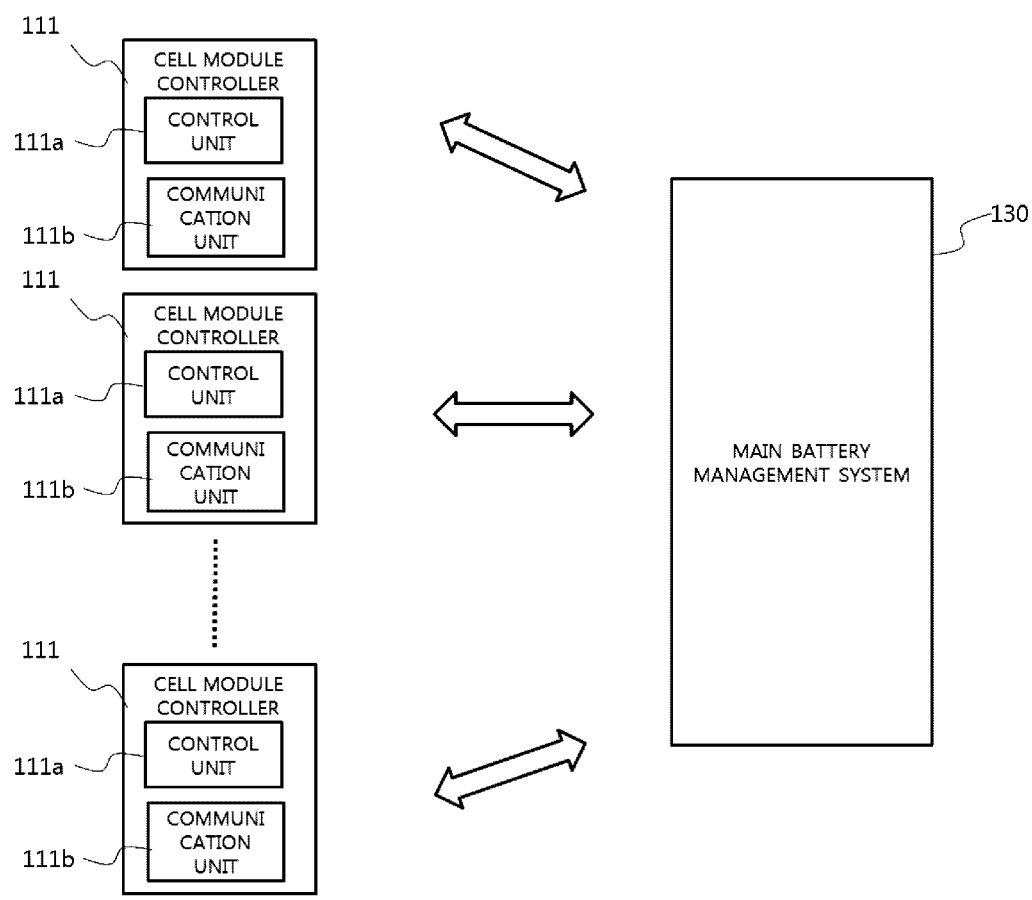

[Figure 5]
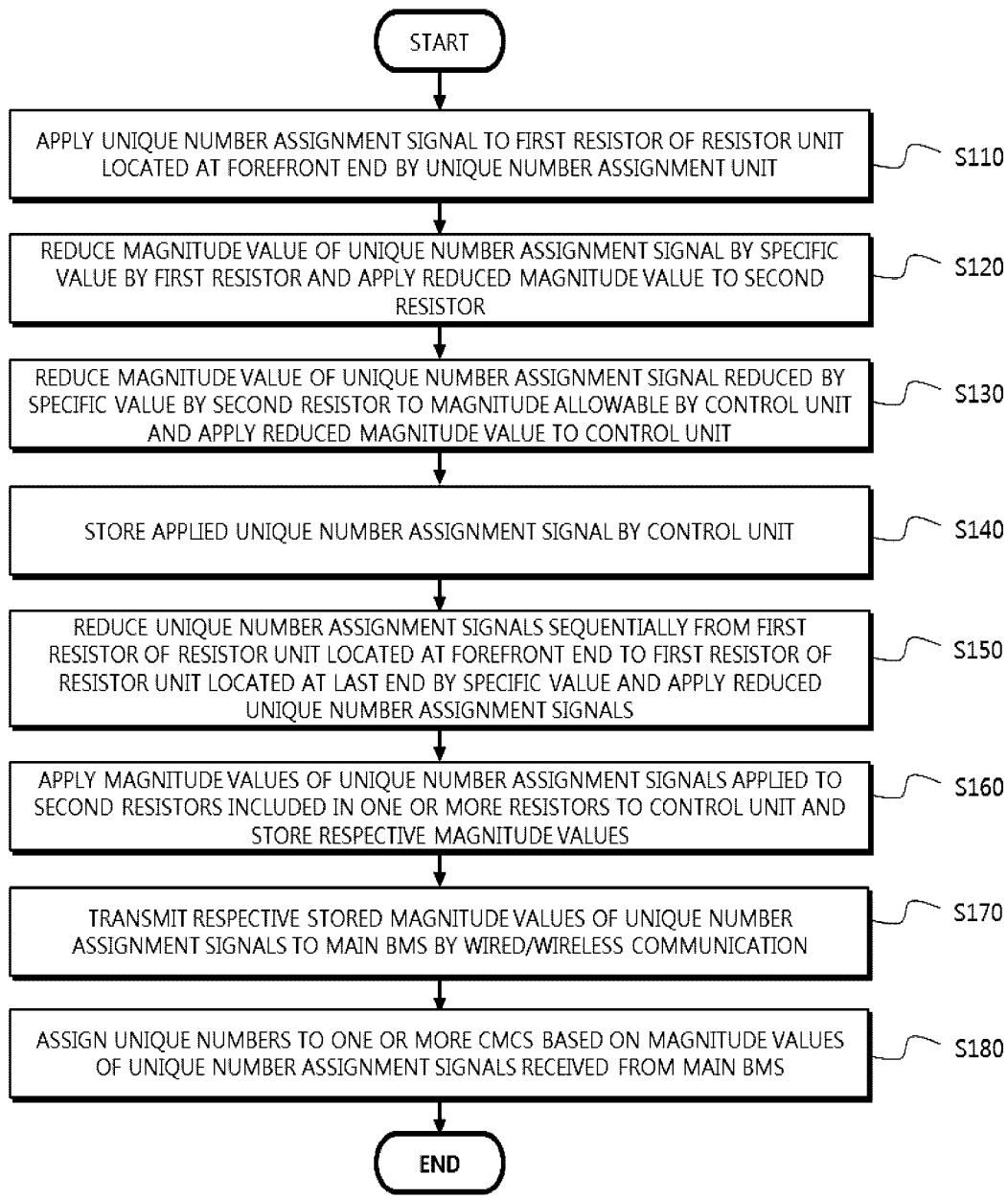

SYSTEM AND METHOD FOR ASSIGNING UNIQUE NUMBER TO CELL MODULE CONTROLLER

TECHNICAL FIELD

This application claims priority to and the benefit of Korean Patent Application No. 10-2017-0020549 filed in the Korean Intellectual Property Office on Feb. 15, 2017, the entire contents of which are incorporated herein by reference.

The present invention relates to a system and a method for assigning a unique number to a cell module controller, and more particularly, to a system and a method for assigning a unique number to a cell module controller, which apply unique number assignment signals to one or more resistor units connected to one or more cell module controllers, respectively, through a main BMS and assign unique numbers to one or more cell module controllers based on voltage values of the unique number assignment signals applied to one or more resistor units, respectively, to assign the unique numbers to one or more cell module controllers by simple circuit implementation without adding a separate unique number assignment module.

BACKGROUND ART

In general, in a secondary battery, in environments requiring a high capacity, such as an electric vehicle, an energy storage system, and an interruptible power supply, one battery module can be used by connecting a plurality of unit secondary battery cells and in some cases, a plurality of battery modules may be connected and used.

When the plurality of battery modules is used together, the battery module is overheated due to an abnormal operation such as overcurrent and overvoltage, which may cause the battery module to swell and be damaged. In order to solve such a problem, a technique is required, which continuously measures and monitors various state information such as voltage, current, and temperatures of respective individual modules when the plurality of battery modules is connected and used and prevents the unit cells from being overcharged and overdischarged.

Therefore, in the related art, in order to solve such a problem, cell module controllers (CMC) are connected to the respective battery modules, respectively, to diagnose and control the state of the battery and a unique number is allocated to each of a plurality of CMCs connected to the plurality of battery modules, respectively, to manage the plurality of battery modules in one main BMS.

Meanwhile, the technique for assigning the unique number in the related art additionally requires a separate unique number assignment module for assigning the unique number for each one CMC and as the number of connected battery modules increases, the number of unique number assignment modules also increases, and as a result, cost for manufacturing an entire system increases and a volume of the entire system increases.

Accordingly, in order to solve the problems associated with the system and the method for assigning a unique number to a cell module controller in the related art, the present inventor has invented a system and a method for assigning a unique number to a cell module controller have been invented, which assign unique numbers to one or more cell module controllers, respectively, based on voltage values of unique number assignment signals applied to one or more resistor units connected to one or more cell module controllers, respectively, to assign the unique numbers to one or more cell module controllers by simple circuit implementation without adding a separate unique number assignment module, a diode, and a bipolar junction transistor (BJT).

DETAILED DESCRIPTION OF THE INVENTION

Technical Problem

The present invention is contrived to solve the problem and the present invention has been made in an effort to provide a system and a method for assigning a unique number to a cell module controller, which assign unique numbers to one or more cell module controllers, respectively, based on voltage values of unique number assignment signals applied to one or more resistor units connected to one or more cell module controllers, respectively, to assign the unique numbers to one or more cell module controllers by simple circuit implementation without adding a separate unique number assignment module, a diode, and a bipolar junction transistor (BJT).

Technical Solution

According to an embodiment of the present invention, a system for assigning a unique number to a cell module controller may include: one or more cell module controllers (CMCs) connected to one or more battery modules, respectively, and storing assigned unique numbers; one or more resistor units connected to one or more CMCs, respectively; and a main battery management system (BMS) applying unique number assignment signals to one or more resistor units, and the main BMS may assign the unique numbers to one or more CMCs based on voltage values of the unique number assignment signals applied to the resistor units.

In the embodiment, the respective CMCs may include control units receiving and storing the unique number assignment signal from the resistor unit, respectively, and the respective resistor units may include first resistors reducing the voltage values of the unique number assignment signals by a specific value, and second resistors reducing the voltage values of the unique number assignment signals, which are reduced by the specific value to magnitudes allowable by the control units, respectively.

In the embodiment, the main BMS may include a unique number assignment unit outputting the unique number assignment signal, and a pull down resistor, and one side of a resistor unit located at a forefront end among one or more resistor units may be connected with the unique number assignment unit and one side of a resistor unit located at a last end may be connected to the pull down resistor.

In the embodiment, the voltage value of the unique number assignment signal may be 12 V.

In the embodiment, one or more resistor units may be connected in series.

According to another embodiment of the present invention, a method for assigning a unique number to a cell module controller may include: applying, by a main battery management system (BMS), unique number assignment signals to one or more resistor units connected with one or more cell module controllers (CMCs), respectively; and assigning, by the main BMS, unique numbers to one or more CMCs based on voltage values of the unique number assignment signals applied to the resistor units.

In the embodiment, the applying of the unique number assignment signals may include reducing, by first resistors, the voltage values of the unique number assignment signals by a specific value, and reducing, by second resistors, the voltage values of the unique number assignment signals, which are reduced by the specific value to magnitudes allowable by the control units, and the assigning of the unique numbers may include receiving and storing, by the control unit, the unique number assignment signals reduced to magnitudes allowable from the second resistors.

In the embodiment, the applying of the unique number assignment signals may further include outputting, by a unique number assignment unit, the unique number assignment signal, and one side of a resistor unit located at a forefront end among one or more resistor units may be connected with the unique number assignment unit and one side of a resistor unit located at a last end may be connected to the pull down resistor.

In the embodiment, the voltage value of the unique number assignment signal may be 12 V.

In the embodiment, one or more resistor units may be connected in series.

Advantageous Effects

According to the present invention, it is advantageous in that unique numbers are assigned to one or more cell module controllers, respectively, based on voltage values of unique number assignment signals applied to one or more resistor units connected to one or more cell module controllers, respectively, from a main BMS to assign the unique numbers to one or more cell module controllers by simple circuit implementation without adding a separate unique number assignment module, a diode, and a bipolar junction transistor (BJT).

BRIEF DESCRIPTION OF DRAWINGS

FIG. 1 is a diagram schematically illustrating a configuration of a system 100 for assigning a unique number to a cell module controller according to an embodiment of the present invention.

FIG. 2 is a diagram more specifically illustrating the configuration of the system 100 for assigning a unique number to a cell module controller according to the embodiment of the present invention.

FIG. 3 is a diagram more specifically illustrating a connection relationship between a cell module controller 111 and a resistor unit 121 in the system 100 for assigning a unique number to a cell module controller according to the embodiment of the present invention.

FIG. 4 is a diagram schematically illustrating a type in which one or more cell module controllers 111 to 11N and a main battery management system 130 transmit/receive a voltage value of a unique number assignment signal through wired/wireless communication in the system 100 for assigning a unique number to a cell module controller according to the embodiment of the present invention.

FIG. 5 is a flowchart for describing a series of processes of assigning unique numbers to one or more cell module controllers 111 to 11N through a system 100 for assigning a unique number to a cell module controller according to an embodiment of the present invention.

BEST MODE

Hereinafter, a preferred embodiment is presented in order to assist understanding of the present invention. However, the following embodiment is just provided to more easily understand the present invention and contents of the present invention are not limited by the embodiment.

FIG. 1 is a diagram schematically illustrating a configuration of a system 100 for assigning a unique number to a cell module controller according to an embodiment of the present invention and FIG. 2 is a diagram more specifically illustrating the configuration of the system 100 for assigning a unique number to a cell module controller according to the embodiment of the present invention.

Referring to FIGS. 1 and 2, the system 100 for assigning a unique number to a cell module controller according to the embodiment of the present invention may include a cell module controller (CMC) 110, a resistor unit 120, and a main battery management system (BMS) 130.

First, the CMC 110 may be connected to each of one or more battery modules 10, and to this end, the CMC 110 may be constituted by one or more CMCs. In addition, one or more CMCs 111 to 11N may serve to store assigned unique numbers and to this end, one or more CMCs 111 to 11N may include control units 111a to 11Na, respectively. Herein, the unique number may mean an identification number assigned to each of one or more CMCs 111 to 11N to identify one or more CMCs 111 to 11N.

The control units 111a to 11Na may receive and store unique number assignment signals from the resistor unit 120 to be described below. In the embodiment, the control units 111a to 11Na may be microcontroller units (MCUs) and may receive the unique number assignment signal to measure voltage values of the unique number assignment signals applied to the resistor unit 120 to be described below. In addition, the control units 111a to 11Na are configured with a separate storage unit (not illustrated) to store the measured voltage values of the unique number assignment signals.

In another embodiment, the control units 111a to 11Na may be configured without a separate storage unit and may not store but transmit the voltage values of the applied unique number assignment signals to the main BMS 130 through one or more communication units 111b to 11Nb to be described below, respectively, as illustrated in FIG. 4.

The resistor unit 120 may be connected to each of one or more CMCs 111 to 11N and to this end, the resistor 120 may be constituted by one or more resistor units. Further, the resistor unit 120 may serve to receive the unique number assignment signals from the main BMS 130 to be described below and reduce the voltage values of the received unique number assignment signals and apply the reduced voltage values to one or more CMC 111 to 11N. To this end, one or more resistor units 121 to 12N may include first resistors 121a to 12Na and second resistors 121b to 12Nb, respectively. Herein, the unique number assignment signal may be an identification signal applied to assign the unique number for identification to each of one or more CMCs 111 to 11N. As an example, the unique number assignment signal may be voltage having a magnitude of 12 V.

The first resistors 121a to 12Na may reduce the voltage value of the unique number assignment signal by a specific value. Herein, the specific value may be a value set to reduce the voltage value of the unique number assignment signal applied to each of one or more resistor units 121 to 12N so as to make the voltage values of the unique number assignment signals different. For example, when the specific value is 1 V, N resistor units 121 to 12N are connected to N CMCs 111 to 11N, respectively, and the unique number assignment signal having the magnitude of 12 V is applied to the resistor unit 121 located at a foremost end, unique number assignment signals having magnitudes of 11 V to 12−N V may be applied through sequentially reducing the voltage value of 1 V from the resistor unit 121 located at the foremost end up to the resistor unit 12N located at a last end. Accordingly, unique number assignment signals having different magnitudes may be applied to one or more resistor units 121 to 12N and unique number assignment signals having different magnitudes are applied to the CMCs 111 to 11N, respectively, to assign the unique numbers.

The second resistors 121b to 12Nb may reduce the voltage values of the unique number assignment signals lowered by the specific value through the first resistors 121a to 12Na to voltage values having magnitudes allowable by the control units 111a to 11Na. For example, when the control units 111a to 11Na are MCUs, the control units 111a to 11Na may allow the voltage values within 3V to 5V. Accordingly, the second resistors 121b to 12Nb may reduce the voltage values of the unique number assignment signals applied from the first resistors 121a to 12Na to 3 V to 5 V to apply the unique number assignment signals to the control units 111a to 11Na normally. Hereinafter, a configuration for applying the unique number assignment signals to one or more resistor units 121 to 12N through one or more resistor units 121 to 12N will be described in more detail with reference to FIG. 3.

FIG. 3 is a diagram more specifically illustrating a connection relationship between a cell module controller 111 and a resistor unit 121 in the system 100 for assigning a unique number to a cell module controller according to the embodiment of the present invention.

Referring to FIG. 3, the resistor unit 121 may include a first resistor 121a and a second resistor 121b and the second resistor 121b may include two resistors 121b-1 and 121b-2 connected in series. The unique number assignment signal applied from the main BMS 130 may be applied to the first resistor 121a and may be reduced by a specific value and applied to the second resistor 121b. The unique number assignment signal reduced by the specific value by the first resistor 121a is applied to two resistors 121b-1 and 121b-2 included in the second resistor 121b and the voltage value of the unique number assignment signal applied to one resistor 121b-2 of two resistors 121b-1 and 121b-2 through voltage distribution is applied to the control unit 111a of the CMC 111. For example, when the voltage value of the unique number assignment signal reduced by the specific value from the first resistor 121a is 8 V and the magnitudes of two resistors 121b-1 and 121b-2 are the same, the voltage value of the unique number assignment signal applied from the first resistor 121a is ½ and 4 V is applied to the control unit 111a.

In an embodiment, the magnitudes of one or more second resistors 122 included in one or more resistor units 121 to 12N, respectively, may all be the same value. Unique number assignment signals having different magnitudes reduced through the first resistor 121 may be applied to one or more second resistors 122 having the same resistance value and are respectively reduced at the same ratio through the second resistor 122 or a predetermined voltage value is reduced to apply each of the unique number assignment signals having different voltage values to the control unit 111.

In another embodiment, the resistor unit 120 may be constituted by only the second resistor 122 and the voltage values of one or more second resistors 122 included in one or more resistor units 121 to 12N are set to be different from each other to adjust the voltage values of the unique number assignment signals applied from the main BMS 130 to be different from each other and apply the adjusted voltage values to the control unit 111.

Referring back to FIGS. 1 and 2, the main BMS 130 may serve to output the unique number assignment signal to the resistor unit 120. To this end, the main BMS 130 may include a unique number assignment unit 131.

The unique number assignment unit 131 may be connected to one side of the resistor unit 121 located at the foremost end of one or more resistor units 121 to 12N and may apply the unique number assignment signal to the resistor unit 121 located at the foremost end. For example, the unique number assignment unit 131 may be a voltage generator capable of generating a voltage of a predetermined magnitude and by connecting the voltage generator and one or more resistor units 121 to 12N, the voltage of the predetermined magnitude generated from the voltage generator may be applied. One or more resistor units 121 to 12N may sequentially apply the unique number assignment signals applied to the resistor unit 121 located at the foremost end from the resistor unit 121 located at the foremost end to the resistor unit 12N located at the last end and to this end, one or more resistor units 121 to 12N may be connected in series.

Further, the main BMS 130 may include a pull-down resistor 132. One side of the pull-down resistor 132 may be connected to the resistor unit 120 located at the last end of one or more resistors 121 to 12N and the other side may be connected to a ground terminal. Therefore, one or more resistor units 121 to 12N may maintain a low level state of the voltage. Further, when one or more switches (not illustrated) installed for stability maintain an OFF state and then are changed to an ON state, a circuit is momentarily short-circuited to prevent a large amount of current from flowing, thereby enhancing stability of the system for assigning a unique number to a cell module controller according to the embodiment of the present invention.

In one embodiment, the main BMS 130 may receive the voltage values of the unique number assignment signals from one or more CMCs 111 to 11N and assign the unique numbers to one or more CMCs 111 to 11N based on the received voltage values of the unique number assignment signals. As an example, one or more CMCs 111 to 11N and the main BMS may transfer the voltage value of the unique number assignment signal by wired/wireless communication. Hereinafter, referring to FIG. 4, a type in which one or more CMCs 111 to 11N and the main BMS transfer the voltage value by the wired/wireless communication will be described.

FIG. 4 is a diagram schematically illustrating a type in which one or more cell module controllers 111 to 11N and a main battery management system 130 transmit/receive a voltage value of a unique number assignment signal through wired/wireless communication in the system 100 for assigning a unique number to a cell module controller according to the embodiment of the present invention.

Referring to FIG. 4, in one embodiment, one or more CMCs 111 to 11N may include communication units 111b to 11Nb, respectively.

One or more communication units 111b to 11Nb may perform wired/wireless communication with the main BMS 130 and may transmit state information of the battery module 10 acquired from one or more CMCs 111 to 11N and each of the voltage values of the unique number assignment signals applied from one or more second resistors 121b to 12Nb to the main BMS 130.

The main BMS 130 may receive the voltage values of the unique number assignment signals applied from one or more second resistors 121b to 12Nb from one or more communication units 111b to 11Nb, respectively, and compares the received voltage values of one or more unique number assignment signals to assign the unique numbers. For example, when the voltage values of the unique number assignment signals applied to three second resistors included in three resistor units connected to three CMCs are 11 V, 8 V, and 5 V, respectively, the CMC connected to the second resistor to which the largest value is applied may be set to #1, the CMC connected to the second resistor to which the second largest voltage value is applied may be set to #2, and the CMC connected to the second resistor to which the smallest value is applied may be set to #3. Conversely, the CMC connected to the second resistor to which the smallest value is applied may be set to #1 and then, the CMCs may be set to #2 and #3 in an order of the smaller voltage value. Hereafter, referring to FIG. 5, a series of processes of assigning unique numbers to one or more CMCs 111 to 11N through a system 100 for assigning a unique number to a cell module controller according to an embodiment of the present invention will be described in more detail.

FIG. 5 is a flowchart for describing a series of processes of assigning unique numbers to one or more cell module controllers 111 to 11N through a system 100 for assigning a unique number to a cell module controller according to an embodiment of the present invention.

First, when a method for assigning a unique number to a cell module controller according to an embodiment of the present invention is disclosed, a unique number assignment unit applies a unique number assignment signal to a first resistor of a resistor unit located at a foremost end (S110). Herein, the unique number assignment signal may be voltage having a magnitude of 12 V. In step S110, the magnitude of the unique number assignment signal applied through the first resistor is reduced by a specific value and the reduced unique number assignment signal is applied to a second resistor (S120). In step S120, the magnitude of the unique number assignment signal reduced by the specific value applied from the first resistor through the second resistor is additionally reduced to be set to a magnitude allowable by a control unit (S130). For example, in step S130, only a part of the magnitude of the unique number assignment signal may be applied to the control unit using voltage distribution. The unique number assignment signal reduced in step S130 is applied to the control unit and the control unit receives and stores a value of the unique number assignment signal (S140).

The unique number assignment signal reduced by the specific value through the first resistor in step S120 is applied to the first resistor of the resistor unit connected to a rear end and again reduced by the specific value through the first resistor of the resistor unit connected to the rear end. Unique number assignment signals sequentially reduced by the specific value from the first resistor of the resistor unit located at the forefront end to the first resistor of the resistor unit located at a last end by the method are applied (S150). The resistor units included in one or more CMCs receive and store unique number assignment signals having different magnitudes from respective second resistors through steps S110 to S150 (S160).

Thereafter, a main BMS receives information on a voltage value of a unique number assignment signal stored by a wired/wireless communication scheme from a communication unit included in each of one or more CMCs (S170). The main BMS assigns unique numbers to one or more CMCs based on the voltage values of one or more unique number assignment signals received from step S170 (S180). For example, one or more CMCs corresponding to the largest voltage value of the unique number assignment signal among the voltage values of one or more received unique number assignment signals may be set to #1 and then, the number may be set in an order of the larger voltage value.

As described above, the system and the method for assigning a unique number to a cell module controller according to the embodiment of the present invention apply unique number assignment signals to one or more resistor units connected to one or more CMCs, respectively, without requiring a separate unique number assignment module for assigning a unique number, a diode, and a bipolar junction transistor (BJT) and assign the unique numbers to one or more CMCs, respectively, based on the voltage values of the applied unique number assignment signals to assign the unique numbers to one or more cell module controllers by simple circuit implementation, thereby reducing cost consumed for manufacturing an entire system and a volume and increasing efficiency of an entire battery management system.

The present invention has been described with reference to the preferred embodiments, but those skilled in the art will understand that the present invention can be variously modified and changed without departing from the spirit and the scope of the present invention which are defined in the appended claims.

The invention claimed is:

1. A system for assigning a unique number to one or more cell module controllers (CMCs), the system comprising:
   the one or more cell module controllers (CMCs) connected to one or more battery modules, respectively, each of the one or more cell module controllers (CMCs) storing an assigned unique number;
   one or more resistor units connected to the one or more CMCs, respectively; and
   a main battery management system (BMS) applying unique number assignment signals to the one or more resistor units,
   wherein the main BMS further assigns the unique numbers to the one or more CMCs based on a respective voltage value of the respective unique number assignment signal applied to the respective one of the one or more resistor units,
   wherein the system is provided without a diode and without a bipolar junction transistor, and
   wherein the one or more resistor units includes:
   first resistors reducing the voltage values of the respective unique number assignment signals by a specific value; and
   second resistors reducing the voltage values of the respective unique number assignment signals, which are reduced by the respective specific value to magnitudes allowable by the respective control unit, each second resistor connected in series with a respective one of the first resistors.

2. The system of claim 1, wherein each CMC includes:
   a control unit configured to receive and store the unique number assignment signal from the respective one of the one or more resistor units.

3. The system of claim 1, wherein the main BMS includes:
   a unique number assignment unit outputting the unique number assignment signals, and
   a pull down resistor, and
   wherein one side of a resistor unit located at a forefront end among one or more resistor units is connected with the unique number assignment unit and one side of a resistor unit located at a last end is connected to the pull down resistor.

4. The system of claim 1, wherein the voltage value of each unique number assignment signal is 12 V.

5. The system of claim 1, wherein the one or more resistor units are connected in series.

6. A method for assigning a unique number to one or more cell module controllers (CMCs), comprising:
  applying, by a main battery management system (BMS), unique number assignment signals to one or more resistor units connected with the one or more cell module controllers (CMCs), respectively; and
  assigning, by the main BMS, a unique number to each of the one or more CMCs based on a voltage value of the respective unique number assignment signal applied to the respective one of the one or more resistor units,
  wherein the system is provided without a diode and without a bipolar junction transistor, and
  wherein the applying of the unique number assignment signals includes:
  reducing, by first resistors the voltage values of the unique number assignment signals by a specific value, and
  reducing, by second resistors, the voltage values of the unique number assignment signals, which are reduced by the specific value, to magnitudes allowable by a control unit of the respective CMC.

7. The method of claim 6,
  wherein the assigning of each unique number includes receiving and storing, by the respective control unit, the respective unique number assignment signal reduced to a magnitude allowable from the respective second resistors.

8. The method of claim 6, wherein the applying of the unique number assignment signals further includes outputting, by a unique number assignment unit, the unique number assignment signals, and
  wherein one side of a resistor unit located at a forefront end among one or more resistor units is connected with the unique number assignment unit and one side of a resistor unit located at a last end is connected to the pull down resistor.

9. The method of claim 6, wherein the voltage value of each unique number assignment signal is 12 V.

10. The method of claim 6, wherein the one or more resistor units are connected in series.

* * * * *